United States Patent
Sherman (10) Patent No.: US 7,664,232 B2
(45) Date of Patent: Feb. 16, 2010

(54) METHOD AND SYSTEM FOR DISTANCE MEASUREMENTS

(75) Inventor: Menny Sherman, Ramat Gan (IL)

(73) Assignee: RIT Technologies Ltd., Tel-Aviv (IL)

( * ) Notice: Subject to any disclaimer, the term of this patent is extended or adjusted under 35 U.S.C. 154(b) by 311 days.

(21) Appl. No.: 10/559,594

(22) PCT Filed: Oct. 6, 2005

(86) PCT No.: PCT/IL2005/001064

§ 371 (c)(1),
(2), (4) Date: Dec. 5, 2005

(87) PCT Pub. No.: WO2006/038214

PCT Pub. Date: Apr. 13, 2006

(65) Prior Publication Data

US 2008/0043930 A1   Feb. 21, 2008

Related U.S. Application Data

(60) Provisional application No. 60/615,584, filed on Oct. 5, 2004.

(51) Int. Cl.
*H04M 1/24* (2006.01)
*H04M 3/06* (2006.01)
*H04M 3/22* (2006.01)

(52) U.S. Cl. .............. 379/27.01; 379/22.02; 379/22.06; 379/22.07; 379/27.03; 379/29.01

(58) Field of Classification Search .............. 379/1.01, 379/1.03, 1.04, 9, 9.06, 10.01, 12, 15.01, 379/22.07, 27.01, 29.01
See application file for complete search history.

(56) References Cited

U.S. PATENT DOCUMENTS

| 5,005,197 | A | * | 4/1991 | Parsons et al. | 379/21 |
| 5,309,499 | A |   | 5/1994 | Webber |  |
| 5,550,894 | A | * | 8/1996 | Charland | 379/2 |
| 5,859,895 | A | * | 1/1999 | Pomp et al. | 379/9.05 |

(Continued)

FOREIGN PATENT DOCUMENTS

FR   2 844 406   3/2004

(Continued)

OTHER PUBLICATIONS

International Search Report for International application No. PCT/IL05/01064, mailed on Aug. 11, 2006.

(Continued)

*Primary Examiner*—Binh K Tieu
(74) *Attorney, Agent, or Firm*—Pearl Cohen Zedek Latzer, LLP (57) ABSTRACT

A method and a system for impairment line testing are provided. The method includes electrically connecting a first terminal of a measurement device, which may be a time domain reflectometer, to both wires of a twisted wire pair of a telephone line, which interconnects a telephone line card with a subscriber. The second terminal of the measurement device is electrically connected to a common reference, which may be the ground reference. Then, the method includes performing an impairment testing on the telephone line from the measurement device toward the subscriber.

18 Claims, 5 Drawing Sheets

U.S. PATENT DOCUMENTS

| | | | |
|---|---|---|---|
| 5,937,033 A * | 8/1999 | Bellows | 379/29.01 |
| 6,026,145 A | 2/2000 | Bauer et al. | |
| 6,215,855 B1 * | 4/2001 | Schneider | 379/22 |
| 6,301,227 B1 * | 10/2001 | Antoniu et al. | 370/241 |
| 6,385,297 B2 * | 5/2002 | Faulkner et al. | 379/1.04 |
| 6,456,694 B1 * | 9/2002 | Posthuma | 379/1.04 |
| 6,466,647 B1 | 10/2002 | Tennyson | |
| 6,480,575 B2 | 11/2002 | Chea, Jr. et al. | |
| 6,496,566 B1 * | 12/2002 | Posthuma | 379/22 |
| 7,212,496 B1 * | 5/2007 | Chong | 370/247 |
| 2003/0076931 A1 | 4/2003 | Nakagawa et al. | |
| 2005/0231882 A1 | 10/2005 | Schmitt et al. | |
| 2006/0193444 A1 * | 8/2006 | Aufenast et al. | 379/22 |

FOREIGN PATENT DOCUMENTS

| | | |
|---|---|---|
| WO | WO 01/45452 | 6/2001 |

OTHER PUBLICATIONS

Supplementary European Search Report for Application No. EP 05 79 6764 (Feb. 13, 2009).

* cited by examiner

METHOD AND SYSTEM FOR DISTANCE MEASUREMENTS

CROSS-REFERENCE TO RELATED APPLICATIONS

This application is a National Phase Application of PCT International Application No. PCT/IL2005/001064, International Filing Date, Oct. 6, 2005, claiming priority of U.S. Provisional Application No. 60/615,584, filed Oct. 5, 2004.

BACKGROUND OF THE INVENTION

There is a demand for subscriber lines of plain old telephone services (POTS) to carry high-speed digital signals. Current line testing methods to predict the ability of existing subscriber lines to support high-speed digital transmissions, such as time domain reflectometer (TDR) and frequency domain measurements are usually being carried without automation. The twisted pair wire connected to a telephone line card of the switch is manually disconnected from the line card. The line testing device, such as, time domain reflectometer (TDR) is then connected to the open end of the line and accordingly the measurement is performed as if the telephone line is an unused spare line. The TDR measurements are performed on unused or disconnected wire pairs as to avoid echo pulses or interference from active devices, such as the telephone line cards. After completion of the measurement, the twisted pair wire is manually reconnected to the line card.

An existing solution, which enables some automation of the line testing process involves the installation of a disconnection automated unit, such as a matrix, within the existing infrastructure of the telephone operating company (TELCO). Such a solution is very expensive and not always practical to implement within an operating network.

Accordingly, existing methods are expensive, time and labor consuming, sensitive to human errors and involve disturbance to the POTS service. Therefore, there is a need for a method and a system that overcomes these disadvantages.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features and advantages thereof, may best be understood by reference to the following detailed description when read with the accompanied drawings in which:

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However, it will be understood by those of ordinary skill in the art that the present invention may be practiced without these specific details. In other instances, well-known methods, procedures, components and circuits have not been described in detail so as not to obscure the present invention.

Figure 1:
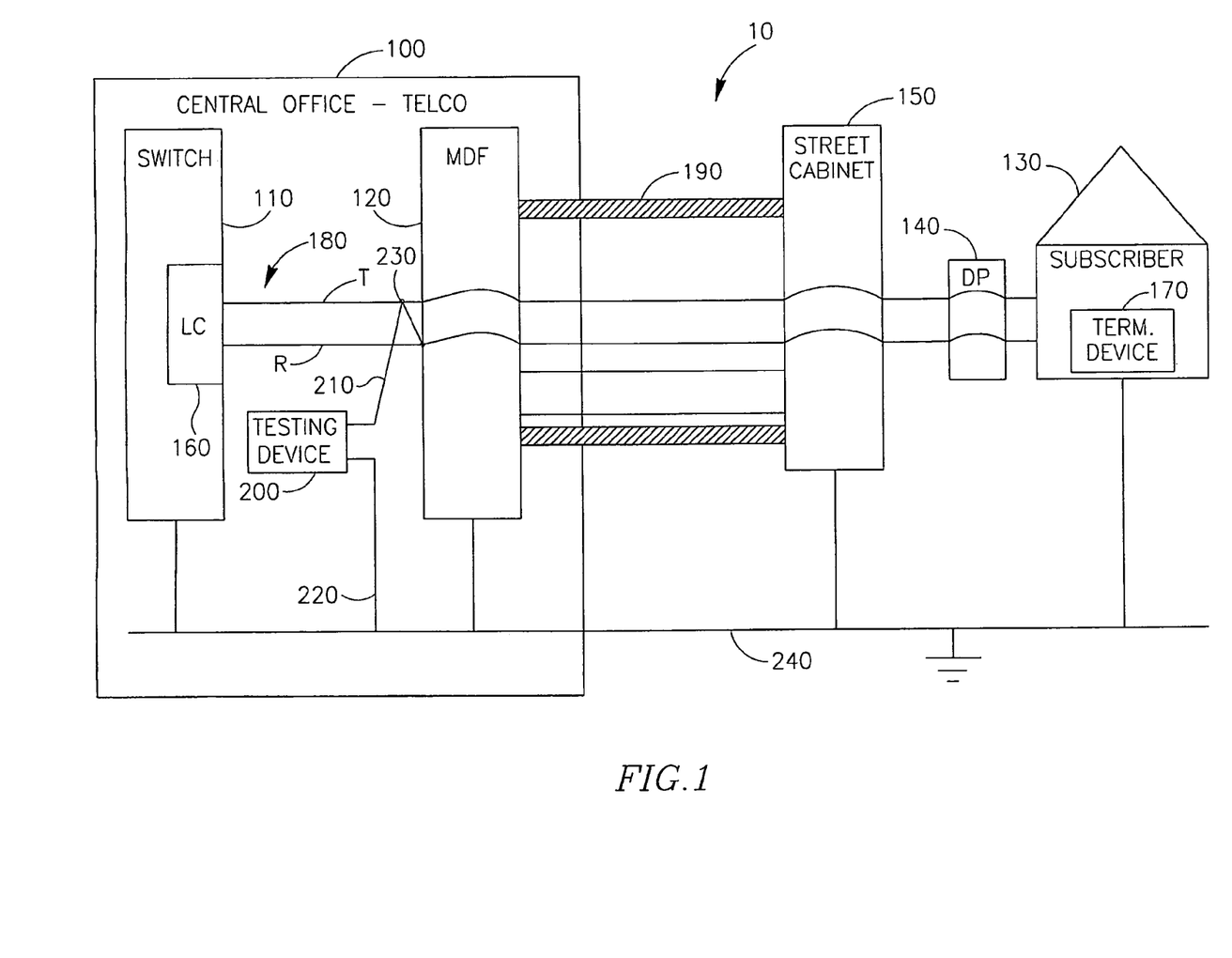
FIG. 1 is a simplified block-diagram of a portion of a POTS network having a testing device according to some embodiments of the present invention.

Reference is now made to FIG. 1, which shows a simplified block-diagram illustration of a portion of a standard infrastructure of a telephone operating company (TELCO) network having a line testing device according to some embodiments of the present invention. Network 10 may comprise TELCO environment 100 having a switch 110 and a main distribution frame (MDF) 120. Network 10 may further comprise a subscriber premises 130, a distribution point (DP) 140 coupled to subscriber premises 130 and a street cabinet 150 coupled to DP 140.

Switch 110 may comprise telephone line cards, such as line card 160 to connect a termination device 170 within subscriber premises 130 to the telephone network 10 using a subscriber line 180. Subscriber line 180 may be additionally referred to as an active telephone line. Throughout the specification and the claims, the term "subscriber line" refers to the entire line interconnecting the line card with the subscriber or portions thereof. Throughout the specification and the claims, the term "active telephone line" refers to a telephone line that interconnects a telephone line card with a subscriber. Subscriber line 180 may comprise a standard twisted two-wire telephone line also referred to as a twisted pair wire. The two wires are generally referred to as the ring (R) and the tip (T) wires. To enable transmission of voice, Subscriber line 180 may exit telephone line card 160 and may connect line card 160 to MDF 120 using a twisted pair wire. Other sections of subscriber line 180 may be housed within a multi pair cable carrying a plurality of lines in a closed packed configuration. For example, the section of subscriber line 180 between MDF 120 and street cabinet 150 is housed within a multi pair cable 190. Additionally, unused twisted pair wires housed within multi pair cable 190 as spare lines for future use may connect street cabinet 150 only to MDF 120 without being connected to switch 110.

TELCO environment 100 may further comprises a testing device 200 connectable to subscriber line 180. Although in the exemplary embodiment of FIG. 1, the testing device is connectable to the subscriber line within the TELCO environment It should be understood to a person skilled in the art that the testing device may be connectable to subscriber line at other locations along the telephone line. If required, the testing device may be connected to subscriber line 180 such that a first terminal 210 is connected to both the tip and ring wires at location 230 and a second terminal 220 is connected to a ground reference 240, as shown in FIG. 1. Such a configuration, which may involve a short circuit between the two wires of a twisted wire pair, may emulate an off-hook line state. Accordingly, the interference of the line card to the measurement results may be neutralized.

The ground reference, which is a common reference plane for the cable itself, the TELCO environment, the street cabinet and the subscriber premises, closes the electrical circuit required for the measurement, from the access point at the TELCO environment to the termination device and back. It should, however, be understood to a person skilled in the art that any common-reference plane may be used.

Figure 2:
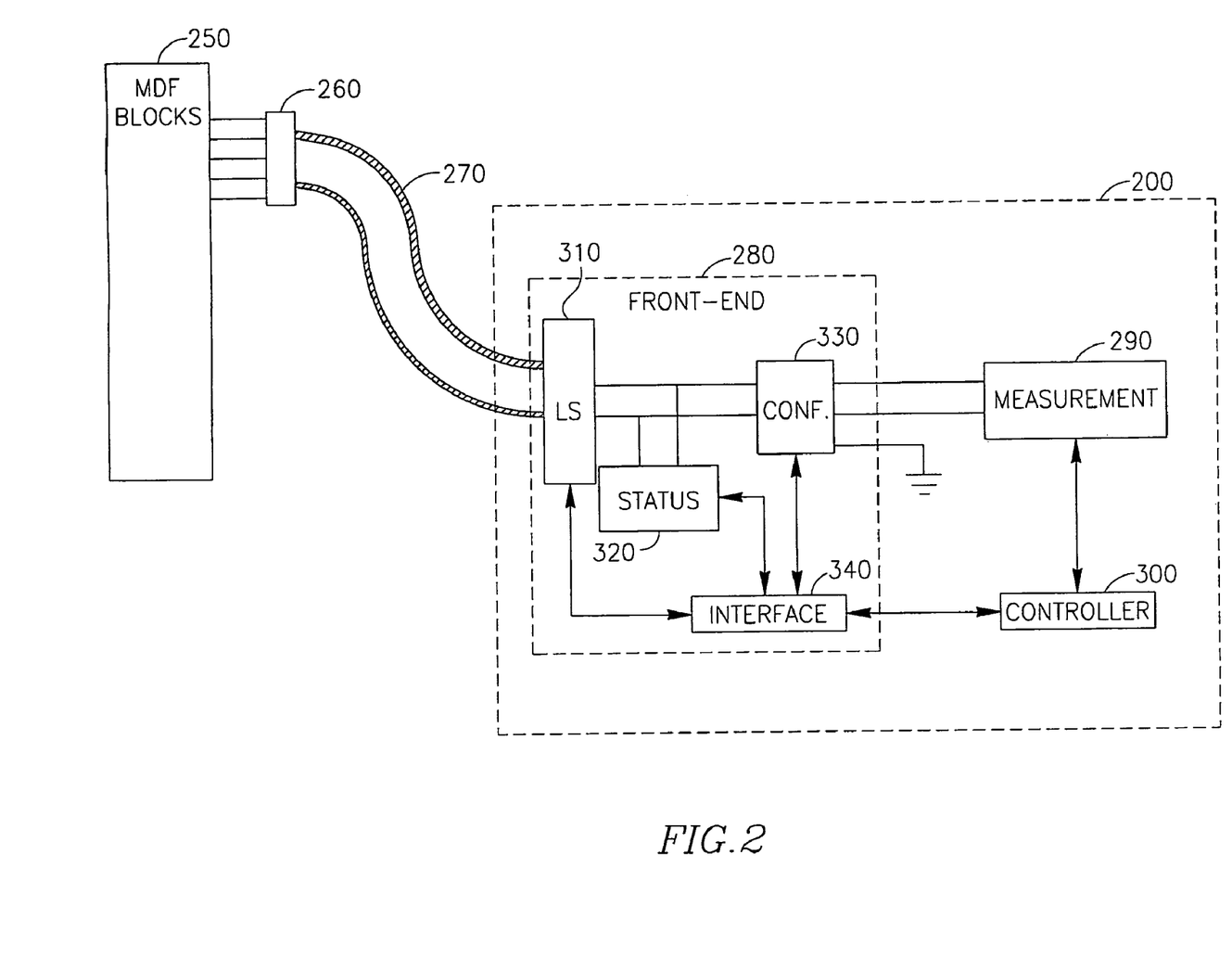
FIG. 2 is a block-diagram illustration of the testing device of FIG. 1 according to some embodiments of the present invention.

Reference is now made to FIG. 2, which is a block-diagram illustration of the testing device of FIG. 1 coupled via a front tap shoe connector to an MDF block. according to some embodiments of the present invention.

According to embodiments of the present invention, for enablement of automatic mass qualification of telephone lines, testing device 200 may access the telephone lines coupled to MDF 120 using front tap shoe connectors, such as, for example, various shoe connectors designed by RiT technologies of Tel-Aviv, Israel. The shoe may include a plurality of contacts, for example 100 contacts, simultaneously connectable a plurality of twisted wire pairs. In the exemplary illustration of FIG. 2, testing device 200 is coupled to an MDF block 250 through a front tap shoe connector 260. It should be understood to a person skilled in the art that more than one shoe may be concurrently connected to the testing device for automatic handling of a larger amount of telephone lines.

A multi pair cable 270, which may hold a plurality of twisted wires pairs may connect shoe connector 260 and testing device 200. According to embodiments of the present invention, once shoe connector 260 is connected to the testing device 200, the mass qualification test of all the telephone lines coupled to the shoe connector may be carried out automatically without further human interference, as described below in relation to FIG. 5.

Testing device 200 may comprise a front-end unit 280, a measurement unit 290, such as TDR unit, coupled to front-end unit 280 and a controller 300, which may be a portable personal computer. Controller 300 may be coupled to both measurement unit 290 and to front-end unit 280.

Measurement unit 290 may be a conventional TDR. TDR operates by transmitting pulse signals along a wire pair and measuring the reflection to determine discontinuity at the transmission line by identifying changes in the impedance of the wire pair.

The TDR comprises a pulse generator to generate and transmit the pulses when instructed by controller 300 and a signal receiver to receive the reflected pulse, when a reflection occurs. Then, the TDR measures the amplitude of the reflected pulse and the time interval between the transmission of the pulse and the reception of the reflected pulse. The measured time interval is used to determine the distance from the location of transmission to the location of the event, namely an impedance discontinuity that caused the reflection. Such events may be the termination of the telephone line at the termination device or other impairments along the line.

Front-end unit 280 may comprise a line selector 310 having an array of relays. Line selector 310 may be able to automatically select one of the twisted wires pairs held by multi pair cable 270 and to connect the selected pair to measurement unit 290 for line testing.

Front-end unit 280 may further comprise a line status detector 320, such as, for example a direct current (DC) voltmeter or a spectral analysis unit. As the tested telephone line remains connected to the telephone line card, it may be busy carrying voice to its corresponding termination device at any time. In order to avoid interference to busy telephone lines, line status detector 320 may execute a preliminary voltage measurement on the selected telephone line before starting the distance measurement testing to determine the status of the selected telephone line.

If the DC voltage of the selected telephone line drops below a predetermined threshold, such as, for example 15 Volts, the telephone line may be identified as a busy line. The distance measurement testing for a selected telephone line identified as having a status of "busy line" is postponed until the telephone call is terminated and the telephone line is identified as a free line. Additionally, line status detector 320 may identify the type of the selected telephone line as being either a digital or an analog line. Although not specifically mentioned, it should be understood to a person skilled in the art that line status detector 320 may perform additional measurements for digital service identification, such as, for example spectral analysis measurements.

Front-end unit 280 may further comprise a configuration unit 330 coupled to line selector 310 and to measurement unit 290. Configuration unit 330 is able to connect the selected tip and ring wires to measurement unit 290 in various test configurations, as required, based on the status of the telephone line.

Figure 3:
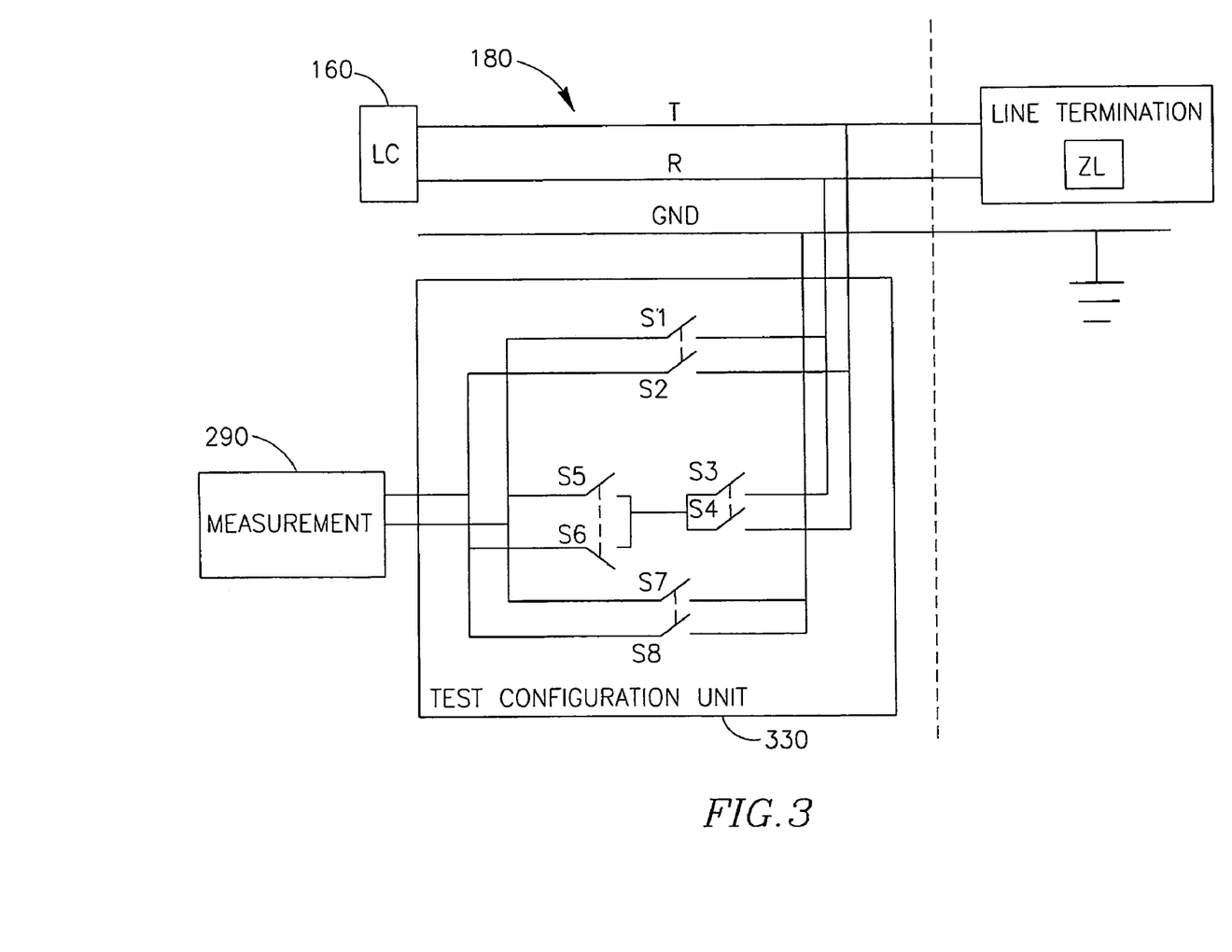
FIG. 3 is a block-diagram illustration of a test configuration unit according to some embodiments of the present invention.

Reference is additionally made to FIG. 3, which is an exemplary block-diagram illustration of a test configuration unit according to some embodiments of the present invention. Configuration unit 330 may comprise a plurality of two-state relays S1, S2, S3, S4, S5, S6, S7 and S8 to enable various test configurations. For example, by selecting to close two-state relays S1 and S2, each of the ring and tip wires is connected to a different terminal at measurement unit 290 and accordingly a conventional impairment line testing may be performed from the measurement unit toward the line termination at the subscriber premises.

Another useful configuration for performing the line testing according to embodiments of the present invention may involve selecting to close two-state relays S3 and S4 and as a result electrically connecting the tip and ring wires. In this configuration, electrically connecting the tip and ring may cause short-circuiting between the tip and ring wires.

Further selecting to close two-state relays S5 or S6 may connect both the electrically connected tip and ring wires to a selected one of the terminals of measurement unit 290. The selection of closing two-state relays S7 or S8 may connect the ground plane to the remaining terminal of measurement unit 290. Accordingly, before performing the line testing for an active telephone line coupled to an active telephone line card without disconnecting the telephone line from the telephone line card, a possible configuration may involve closing two-state relays S3, S4, S5 and S8 while all other two-state relays remain open.

Referring back to FIG. 2, front-end unit 280 may further comprise a controller interface unit 340 coupled to line selector 310, line status detector 320, configuration unit 330, measurement unit 290 and to controller 300. Controller 300, which may be a standard portable personal computer, may send hardware commands to the other units and may receive data relating to the measurement testing for data processing. Control interface unit 340 may translate the commands received by controller 300 into switching command signals by using digital circuitry, as known in the art.

Figure 4:
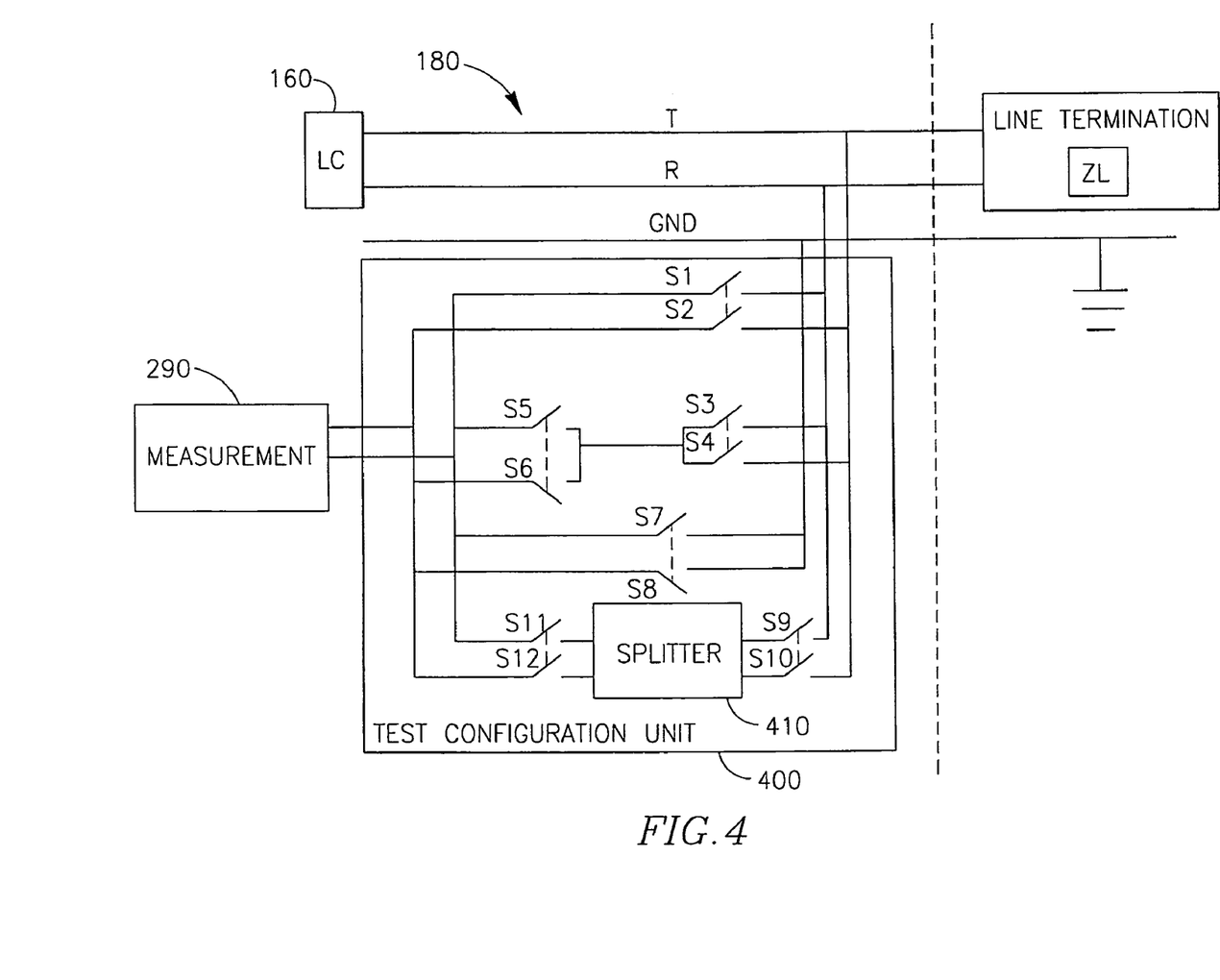
FIG. 4 is a block-diagram illustration of another test configuration unit according to some embodiments of the present invention.

Reference is now made to FIG. 4, which is an exemplary block-diagram illustration of another test configuration unit according to some embodiments of the present invention. According to these embodiments, a test configuration unit 400 may comprise two-state relays S1-S12 to enable various test configurations and a splitter 410. Splitter 410 may be connectable to the tip and ring wires of subscriber line 180 on one end and to measurement unit 290 on the other end. Splitter 410 may prevent signals at low band (voice) frequencies below a predetermined threshold to be transmitted from measurement unit 290 along subscriber line 180 toward subscriber 130 or line card 160. Additionally, Splitter 410 may provide very low impedance, which may emulate a sort-circuit between the tip and ring wires at high frequencies corresponding to the TDR band. Consequently, test configuration unit 400 may enable performing an impairment line testing by transmitting high frequencies (TDR band) to the subscriber line 180 while voice may be carried by the tested subscriber line without interruption to the telephone line service.

As seen in the exemplary illustration of FIG. 4, the splitter mode operation described above may be performed when two-state relays S9, S10, S11 and S8 while all other two-state relays remain open. Alternatively, the filter mode operation described above may be performed when two-state relays S9, S11, S12 and S7 while all other two-state relays remain open.

Figure 5:
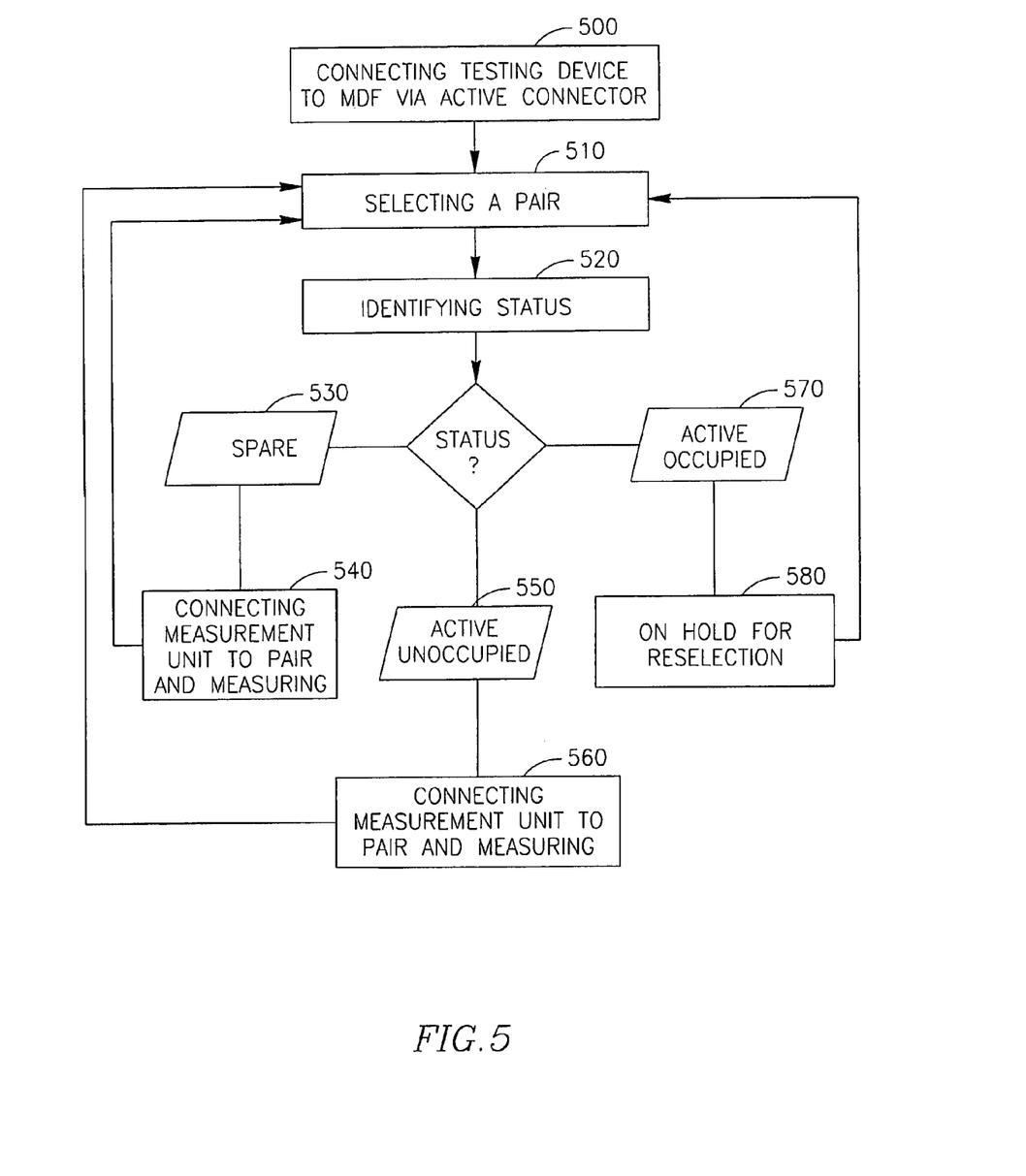
FIG. 5 is flowchart diagram illustration of the line qualification method according to some embodiments of the present invention.

Reference is now made to FIG. 5, which is a flow-chart diagram of a line testing method according to some embodiments of the present invention.

Firstly, an operator may connect front tap shoe connector 260 to MDF block 250 (block 500). Next, controller 300 may instruct line selector 310 to select one of the wire pairs connected to the testing device (block 510). Next, controller 300 may instruct line status detector 320 to identify the type of telephone line selected and the status of the line (block 520).

If the line is a spare line (block 530), controller 300 may instruct configuration unit 330 to connect measurement unit 290 to the selected telephone line such that a first terminal of the measurement unit is connected to the tip wire and a second terminal of the measurement unit is connected to the ring wire. Controller 300 may then instruct measurement unit 290 to transmit a signal along subscriber line 180 toward subscriber 130 and to complete the line testing of the selected line (block 540).

The selected telephone line may be identified as an active line coupled a telephone line card at the switch and as an unoccupied line (not carrying voice) (block 550). If the selected telephone line is identifies as such, controller 300 may instruct the configuration unit to enable connection between measurement unit. 290 and the selected twisted wire pair in a different manner.

According to embodiments of the present invention, for such a line status, a first terminal of the measurement unit is connected to both the tip and ring wires and a second terminal of the measurement unit is connected to a ground reference. Controller 300 may then instruct measurement unit 290 to transmit a signal along subscriber line 180 toward the line termination and to complete the line testing of the selected line (block 560). This operation may occupy the telephone line for several seconds, in which the telephone service is not enabled. Alternatively, if the testing device comprises splitter 400, the impairment line testing may be performed without occupying the telephone line and without any interference to the telephone service.

The selected telephone line may be identified as an active line coupled a telephone line card at the switch and as an occupied line (carrying voice) block 570). If the selected telephone line is identifies as such, controller 300 may instruct line selector 310 to select another telephone line. The testing device is pre-designed such that line selector 310 may reselect the occupied telephone line at a later stage (block 580). Alternatively, if the testing device comprises splitter 400, the impairment line testing may be performed also for an occupied telephone line.

Once the measurement unit completes the testing on a selected twisted wire pair, data may be sent to controller 300 for further processing. Controller 300 then may instruct line selector 310 to disconnect the selected wire pair and to select another twisted wire pair for automatic continuation of the mass line qualification testing. It should be noted that the operations described for a particular selected twisted pair may be terminated within a few seconds.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A method comprising:
   electrically connecting a first terminal of a measurement device to both wires of a twisted wire pair of a telephone line, said telephone line interconnects a telephone line card with a subscriber;
   electrically connecting a second terminal of said measurement device to a common reference; and
   performing an impairment line testing on said telephone line from said measurement device toward said subscriber while the first terminal is connected to said both wires of the twisted wire pair and the second terminal is connected to the common reference by transmitting a signal and receiving a reflected signal via the first terminal along the telephone line.

2. The method of claim 1, wherein electrically connecting said first terminal comprises short-circuiting between said both wires of said twisted wire pair.

3. The method of claim 1, wherein said common reference is a ground reference.

4. The method of claim 1, wherein performing said impairment testing comprises using a time domain reflectometer.

5. The method of claim 1, wherein performing said impairment line testing comprises determining the distance between the location of said measurement device and the location of the termination of said telephone line at the premises of said subscriber.

6. The method of claim 1, wherein electrically connecting said first terminal comprises electrically connecting said first terminal to both wires of said twisted wire pair of said telephone line at the proximity of a main distribution frame unit.

7. The method of claim 1, wherein performing the impairment test comprises:
   automatically and sequentially performing the impairment line testing on a plurality of telephone lines, wherein at least a portion of said telephone lines are active telephone lines and at least one of said telephone lines is a spare line, and performing the impairment line testing on the active lines is done without disconnecting said active telephone lines from their respective telephone line cards.

8. The method of claim 7, wherein performing said impairment line testing comprises determining the distance between the location of said measurement device coupled to one of said telephone lines and the location of the termination of said telephone line at its respective subscriber premises.

9. The method of claim 7, wherein performing said impairment line testing comprises coupling a measurement device at the proximity of a main distribution frame unit.

10. The method of claim 7, wherein performing said impairment line testing comprises performing said line testing on one of said active lines when said active line is carrying telephone signals.

11. The method of claim 7 further comprising:
    identifying one of said plurality of telephone lines as the spare telephone line;

electrically connecting said first terminal of said measurement device to a first wire of a twisted wire pair of said spare telephone line;

electrically connecting said second terminal of said measurement device to a second wire of said twisted wire pair of said spare telephone line; and performing an impairment line testing on said spare telephone line while the first and second terminals are connected to said spare line.

12. An apparatus comprising:

a line selector unit connectable to twisted wire pairs of telephone lines able to select one of said wire pairs for an impairment line testing;

a line status detector to identify the status of said telephone lines; and a configuration unit coupled to said line selector unit and to said line status detector and able to electrically connect a first terminal of a measurement device to both wires of a twisted wire pair of a selected telephone line and a second terminal of said measurement device to a common reference when said selected telephone line is identified as an active telephone line, wherein said apparatus is to perform said impairment line testing on said active telephone line from said measurement device toward a subscriber of said active telephone line while the first terminal is connected to said both wires of the twisted wire pair of said active telephone line and the second terminal is connected to the common reference by transmitting a signal and receiving a reflected signal via the first terminal along the telephone line.

13. The apparatus of claim 12, wherein said configuration unit is able to create short-circuit between said wires.

14. The apparatus of claim 12, wherein said common reference is a ground reference.

15. The apparatus of claim 12, wherein said measurement device is a time domain reflectometer.

16. The apparatus of claim 12, further comprising:

a controller to instruct said measurement unit to perform said impairment line testing.

17. The apparatus of claim 12, wherein said configuration unit comprises a splitter, said splitter is able to prevent signals having a frequency below a predetermined threshold to be transmitted from said measurement unit to said selected telephone line.

18. The apparatus of claim 12, wherein said splitter is able to provide substantially low impedance emulating a short-circuit between said first wire and said second wire at frequencies above said predetermined threshold.

* * * * *